United States Patent
Chiang

(10) Patent No.: US 7,214,632 B2
(45) Date of Patent: May 8, 2007

(54) USING SELECTIVE DEPOSITION TO FORM PHASE-CHANGE MEMORY CELLS

(75) Inventor: Chien Chiang, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 443 days.

(21) Appl. No.: 10/368,759

(22) Filed: Feb. 19, 2003

(65) Prior Publication Data

US 2003/0146452 A1    Aug. 7, 2003

Related U.S. Application Data

(62) Division of application No. 09/948,874, filed on Sep. 7, 2001, now Pat. No. 6,545,287.

(51) Int. Cl.
 *H01L 31/0328*    (2006.01)
 *H01L 29/03*    (2006.01)
 *H01L 47/00*    (2006.01)

(52) U.S. Cl. ............... 438/900; 438/593; 438/652; 438/200; 438/660; 438/669; 438/670; 257/2; 257/3; 257/4; 257/5; 257/200; 257/289

(58) Field of Classification Search ........... 257/200, 257/201, 198, 199, 202, 413; 365/157, 107
See application file for complete search history.

(56) References Cited

U.S. PATENT DOCUMENTS 4,902,645 A * 2/1990 Ohba .................. 438/625
6,111,264 A * 8/2000 Wolstenholme et al. ....... 257/3
6,487,106 B1 * 11/2002 Kozicki .................... 365/153
6,555,429 B2 * 4/2003 Matsui et al. ............. 438/241
6,733,956 B2 * 5/2004 Maimon et al. ........... 430/314

FOREIGN PATENT DOCUMENTS

JP    2-308524    * 12/1990

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S., and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

(Continued)

Primary Examiner—Evan Pert
Assistant Examiner—Fazli Erdem
(74) Attorney, Agent, or Firm—Trop, Pruner & Hu, P.C.

(57) ABSTRACT

A phase-change memory cell may be formed by selectively depositing the lower electrode in the phase-change memory pore. Thereafter, an adhesion-promoting material may be selectively deposited on the selectively deposited lower electrode and the upper surface surrounding the pore. Through the use of selective deposition techniques, the adhesion-promoting material can be positioned where needed and the lower electrode may be defined in a fashion that may reduce shunting current, reduce device current requirements, and increase dynamic range in some embodiments.

17 Claims, 5 Drawing Sheets

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

\* cited by examiner

USING SELECTIVE DEPOSITION TO FORM PHASE-CHANGE MEMORY CELLS

This is a divisional of prior application Ser. No. 09/948,874, filed Sep. 7, 2001 now U.S. Pat. No. 6,545,287.

BACKGROUND

This invention relates generally to electronic memories and particularly to electronic memories that use phase-change material.

Phase-change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally, any phase-change material may be utilized. In some embodiments, however, thin-film chalcogenide alloy materials may be particularly suitable.

The phase-change may be induced reversibly. Therefore, the memory may change from the amorphous to the crystalline state and may revert back to the amorphous state thereafter, or vice versa, in response to temperature changes. In effect, each memory cell may be thought of as a programmable resistor that reversibly changes between higher and lower resistance states. The phase-change may be induced by resistive heating.

In some embodiments, the cell may have a large number of states. That is, because each state may be distinguished by its resistance, a number of resistance determined states may be possible, allowing the storage of multiple bits of data in a single cell.

A variety of phase-change alloys are known. Generally, chalcogenide alloys contain one or more elements from column VI of the periodic table. One particularly suitable group of alloys is GeSbTe alloys.

A phase-change material may be formed within a passage or pore through an insulator. The phase-change material may be coupled to upper and lower electrodes on either end of the pore.

Generally, the lower electrode is formed by a blanket deposition of an appropriate material. However, the use of a blanket deposition results in a lower electrode, extending across the length of the cell, that is capable of shunting the circuit and reducing the dynamic range of the memory cell. As a result, more current may be needed to heat the phase-change material to induce the phase-change.

Another problem relates to the adherence between the insulator defining the pore and the phase-change material. Because of the nature of these materials and the thermal cycling that they must endure, the adherence between the insulator and the phase-change material may be poor. One solution to this problem is to provide an interfacial layer that promotes adhesion between the insulator and the phase-change material. However, depositing the adhesion-promoting layer over silicon dioxide spacers may create adhesion problems as well. Therefore, the use of blanket deposition techniques to deposit the adhesion-promoting layer does not adequately promote adhesion of the phase-change material.

Thus, there is a need for better ways to deposit materials for forming phase-change memories.

DETAILED DESCRIPTION

Figure 1:
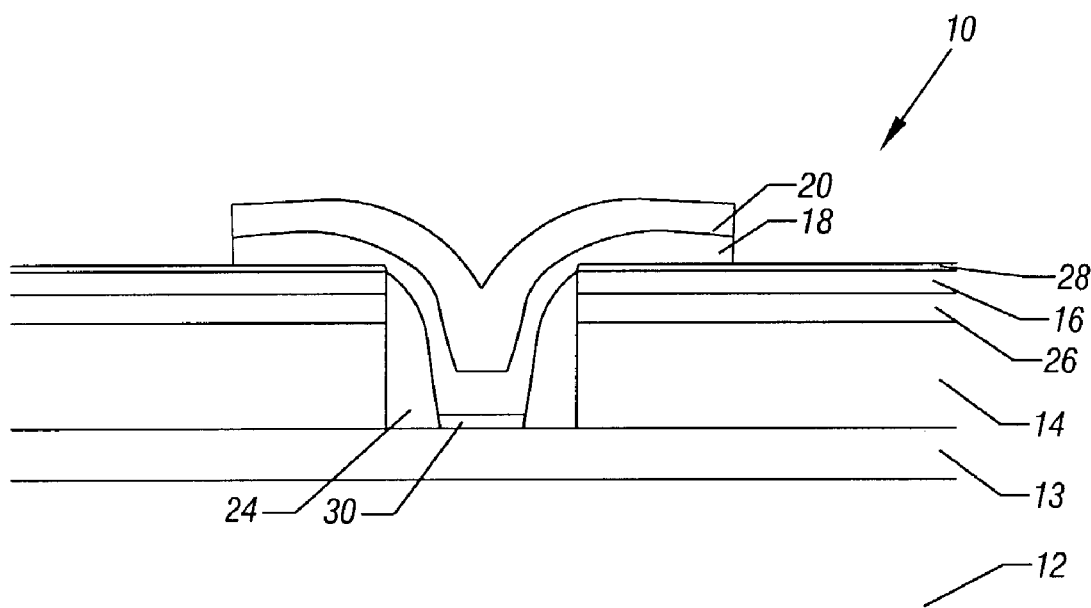
FIG. 1 is an enlarged, cross-sectional view of one embodiment of the present invention.

Referring to FIG. 1, a phase-change memory 10 may be formed on a semiconductor substrate 12 in accordance with one embodiment of the present invention. The substrate 12 may be covered with a lower electrode 13, in turn covered by a layer 14 of an insulating material such as silicon dioxide. The lower electrode 13 may be cobalt silicide as one example. In one embodiment, the layer 14 may in turn be covered by a second insulating layer 26, which is one embodiment may be silicon nitride.

The layer 16 may be covered by an adhesion-promoting layer 28 that is selectively deposited. A pore may be defined by a sidewall spacer 24 within the stack of layers 28, 16, 26, and 14. An adhesion-promoting layer 30 may be selectively deposited on the lower electrode 13. An upper electrode 20 may be defined over the phase-change material 18.

A phase-change material 18 may then be deposited so as to be adhered by the adhesion-promoting layers 30 and 28 over the lower electrode 22 and upper surface of the silicon layer 16. The adhesion-promoting layers 28 and 30 promote adhesion of the phase-change material 18 that may be formed of a chalcogenide alloy in one embodiment.

By selectively depositing the adhesion-promoting layers on the lower electrode 13 and the silicon layer 16, adhesion can be promoted in these advantageous regions. At the same time, coating the sidewall spacer 24 with an adhesion-promoting layer may be avoided. Such a conductive coating on the spacer 24 may result in shunting current around the phase-change material 18 and adversely affecting programming or reading of the memory 10.

Figure 2:
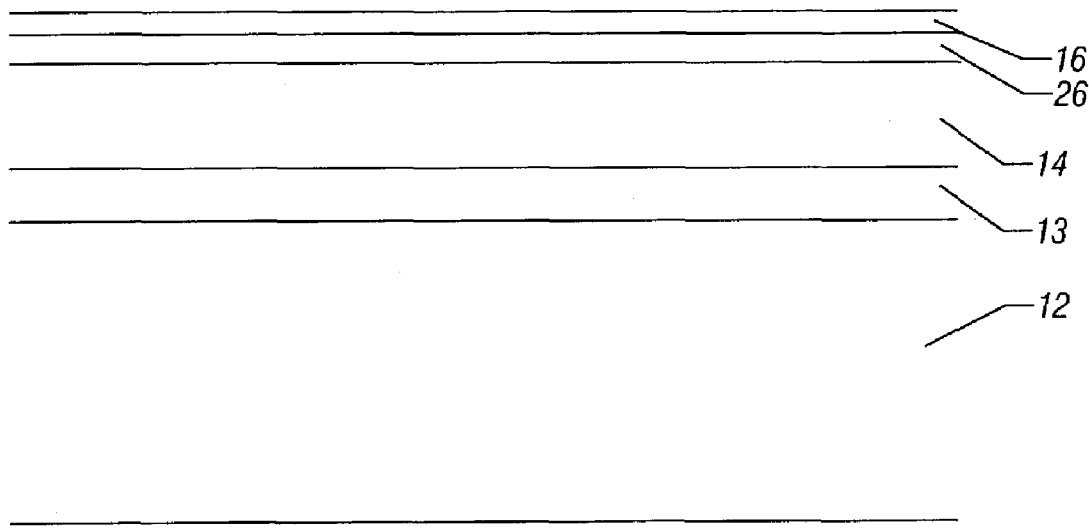
FIG. 2 is an enlarged, cross-sectional view of the embodiment shown in FIG. 1 at an initial stage of manufacturing in accordance with one embodiment of the present invention.
Figure 3:
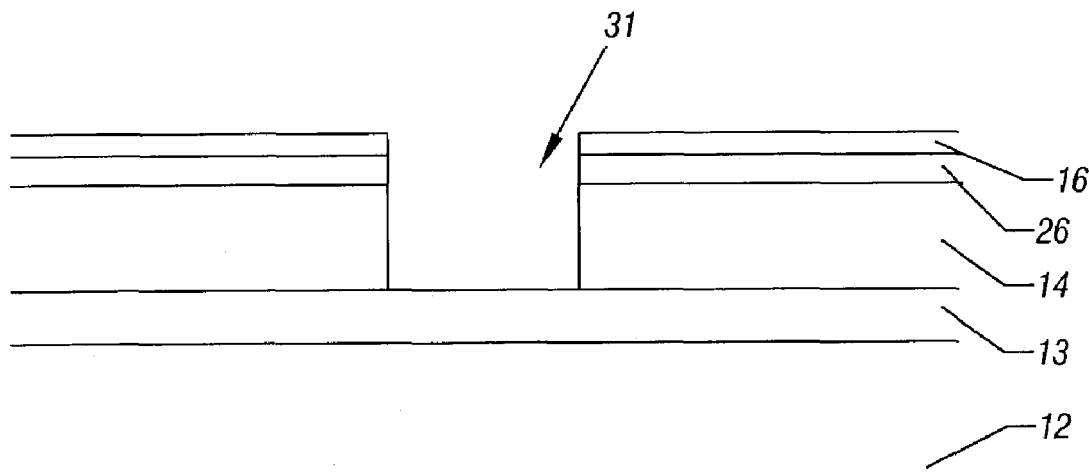
FIG. 3 is an enlarged, cross-sectional view of the embodiment shown in FIG. 2 at a subsequent stage of manufacturing in accordance with one embodiment of the present invention.

Referring to FIG. 2, initially a stack may be formed of a silicon substrate 12, covered by a lower electrode 13, a first insulating layer 14, a second insulating layer 26 and a silicon layer 16. In one embodiment, the layer 14 may be silicon dioxide and the layer 26 may be silicon nitride. A pore 31 may be defined by etching a passage down to the substrate 12 through the layers 16, 26, and 14 as shown in FIG. 3.

Figure 4:
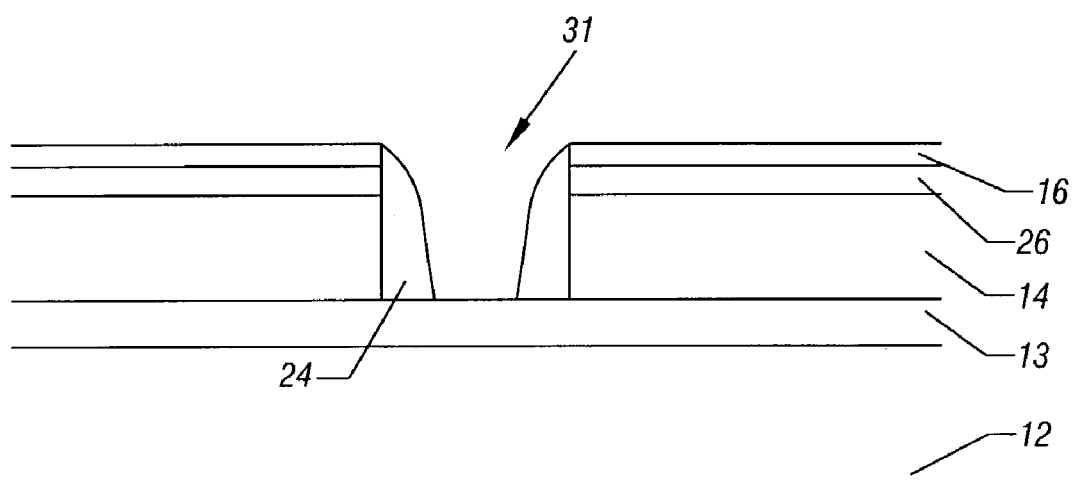
FIG. 4 is an enlarged, cross-sectional view of the embodiment shown in FIG. 3 at a subsequent stage of manufacturing in accordance with one embodiment of the present invention.

Then, as shown in FIG. 4, the sidewall spacer 24 may be formed within the resulting passage or pore 31. The sidewall spacer 24 may be formed by depositing an oxide material, for example, using a tetraethyl orthosilicate (TEOS) process. The deposited oxide is then anisotropically etched to create a cylindrical sidewall spacer 24 within the pore 31.

Figure 5:
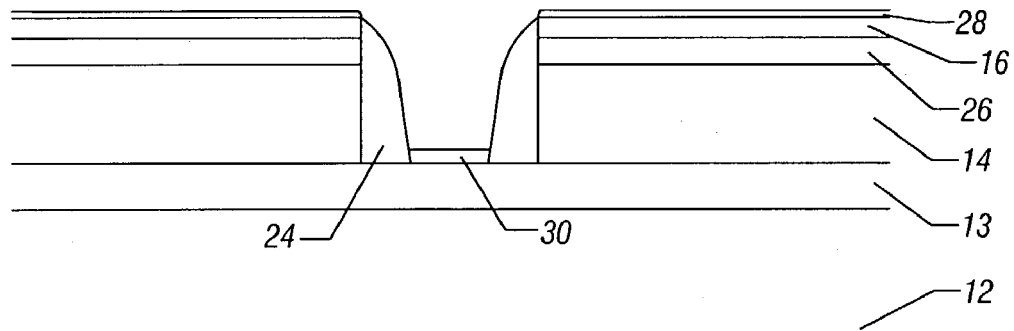
FIG. 5 is an enlarged, cross-sectional view of the embodiment shown in FIG. 4 at a subsequent stage of manufacturing in accordance with one embodiment of the present invention.

Referring to FIG. 5, the adhesion-promoting layer 30 may be selectively deposited over the electrode 13 and the adhesion-promoting layer 28 may be selectively deposited over the silicon layer 16. The adhesion-promoting layers 28 and 30 may be formed of titanium, aluminum, Tungsten, titanium nitride or silicon, to mention a few examples.

A selective chemical vapor deposition process may involve using a charge transfer mechanism to selectively deposit the conductive adhesion-promoting material, as indicated at 28 and 30, and to avoid depositing the adhesion-promoting material on the spacer 24. See e.g., U.S. Pat. No. 6,019,839 to Achutharaman, et al. A process gas mix including a silicon source gas is provided to a chemical vapor deposition chamber in the presence of a deposition gas of titanium tetrachloride. The deposition gas is thermally disassociated to form titanium and silicon atoms that combine to form an epitaxial film on conductive regions of the substrate 12, such as the layers 16 and 13. Thus, the titanium may be deposited on the conductive surfaces, such as the silicon layer 16 and the lower electrode 13, but the titanium is not significantly deposited on the spacer 24, which is formed of an insulator. As a result, a selective deposition process is achieved using electron exchange or charge transport.

Figure 6:
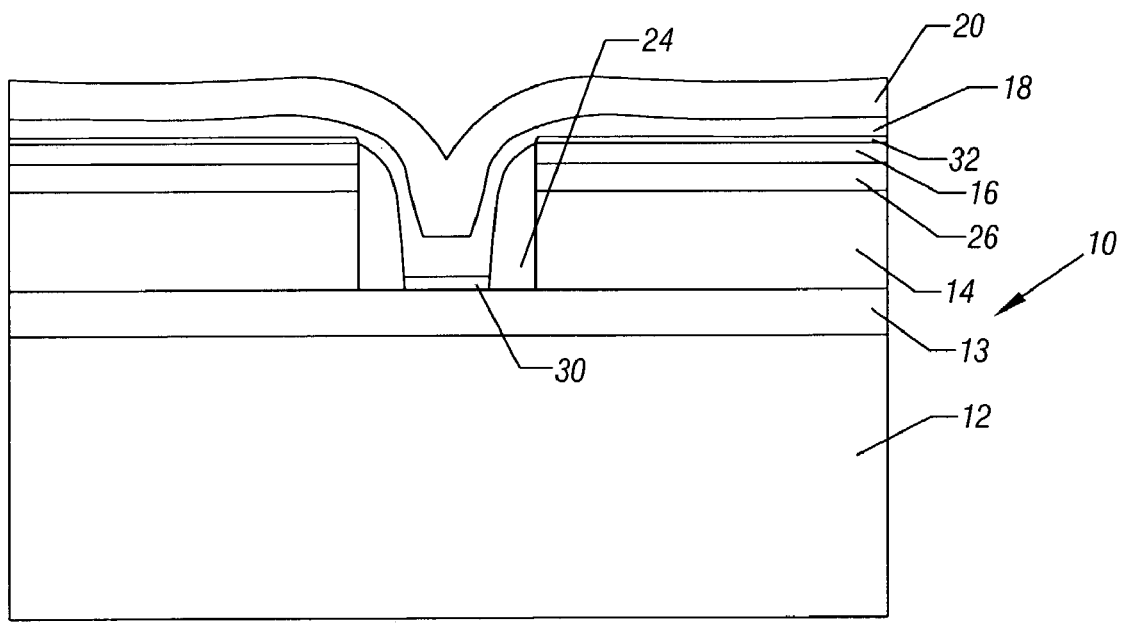
FIG. 6 is an enlarged, cross-sectional view of the embodiment shown in FIG. 5 at a subsequent stage of manufacturing in accordance with one embodiment of the present invention.

Referring to FIG. 6, a phase-change material 18 may be blanket deposited over the resulting structure. Likewise, an upper electrode 20 may be blanket deposited. In one embodiment, the upper electrode 20 may be a sandwich of titanium, titanium nitride and aluminum, in that order. The structure shown in FIG. 1 may be produced using conventional photolithographic techniques.

Figure 7:
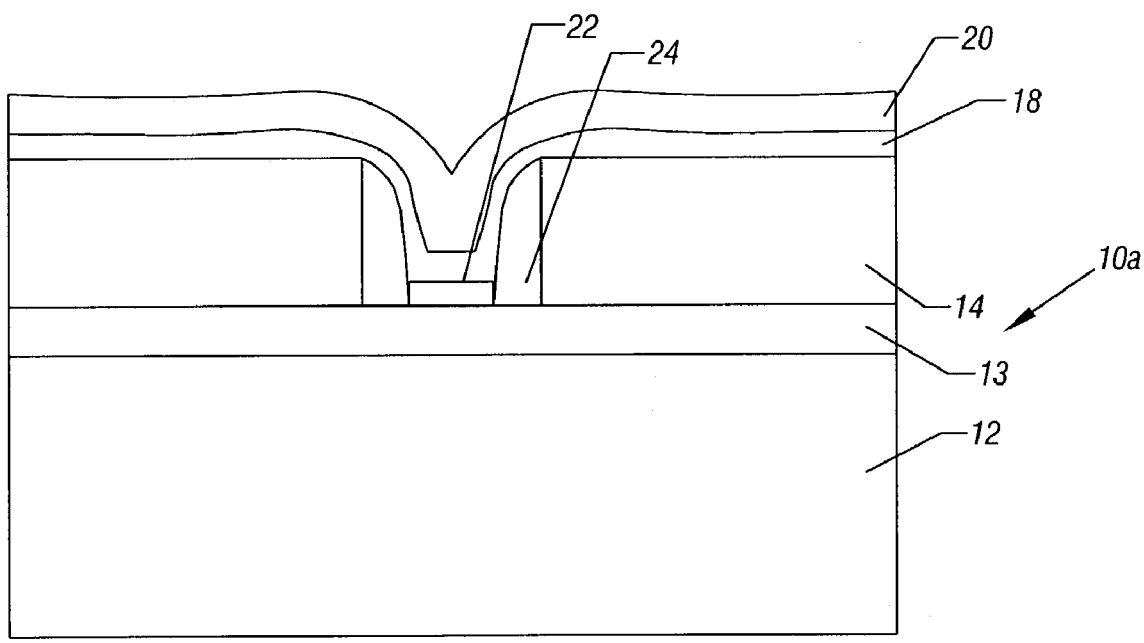
FIG. 7 is an enlarged, cross-sectional view of another embodiment of the present invention.

Referring to FIG. 7, in accordance with another embodiment of the present invention, a lower heater 22 may be selectively deposited. The lower heater 22 may be selectively deposited on the substrate 12 in the region defined by the spacer 24. By selectively depositing only on the substrate 12 and avoiding depositing the material on the sidewall spacer 24, ineffective heating of the phase-change material 18 may be avoided. Namely, if the heater 22 is deposited on both the substrate 12 and the spacer 24, the entire portion of the phase-change material 18 along the spacer 24 is heated. In fact, for effective operation of the memory 10*a*, it is more desirable that only the region at the interface between the lower electrode 13 and the phase-change material be heated.

In one embodiment, selective deposition of the lower heater 22 may be accomplished. Thus, the lower heater 22 may be formed of selectively deposited silicon, for example, by an epitaxial process. Alternatively, titanium nitride, titanium silicon carbide or carbon may be selectively deposited to form the heater 22, as additional examples.

In each case, the selectively deposited material is effective to cause electrical or resistance heating of the phase-change material. This heating is important to programming of the phase-change material 18, for example. Again, the selective deposition process takes advantage of the fact that the only exposed conductive material is the layer 13. As a result, the heater 22 is selectively deposited on the exposed portion of the layer 13, but not on any of the other structures. In particular, the insulator 26 does not provide for charge exchange and, therefore, the lower heater 22 is deposited neither on the spacer 24 nor on the insulator 26.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   defining a pore of a phase-change memory, said pore having a bottom and sidewall;
   forming a non-conductive sidewall spacer in said pore; and
   selectively depositing a lower electrode in said pore in the region defined by said sidewall spacer so as to leave at least a portion of said sidewall uncovered by said electrode.

2. The method of claim 1 wherein defining a pore includes forming a passage through an insulator material.

3. The method of claim 2 further including forming an electrical contact on one end of said pore.

4. The method of claim 1 including selectively depositing an adhesion-promoting layer on said selectively deposited lower electrode.

5. The method of claim 4 including forming said pore through an insulator layer and selectively depositing an adhesion-promoting layer on said insulator layer.

6. The method of claim 1 including depositing a phase-change material over said lower electrode.

7. The method of claim 6 including selectively depositing an upper electrode over said phase-change material.

8. The method of claim 1 including defining the pore of a phase-change memory by forming a contact layer over a semiconductor substrate, forming an insulator layer over said contact layer, and forming a passage through said insulator layer to said contact layer.

9. A method comprising:
   defining a pore of a phase-change memory, said pore having a bottom and sidewall;
   selectively depositing a lower electrode in said pore so as to leave at least a portion of said sidewall uncovered by said electrode; and
   selectively depositing an adhesion-promoting layer on said selectively deposited lower electrode.

10. The method of claim 9 wherein defining a pore includes forming a passage through an insulator material.

11. The method of claim 10 including forming a sidewall spacer in said pore.

12. The method of claim 11 further including forming an electrical contact on one end of said pore.

13. The method of claim 12 wherein selectively depositing includes selectively depositing a lower electrode in the region defined by said sidewall spacer and said contact.

14. A method comprising:
   defining a pore of a phase-change memory by forming a passage through an insulator material, said pore having a bottom and sidewall;
   selectively depositing a lower electrode in said pore so as to leave at least a portion of said sidewall uncovered by said electrode;
   forming a phase change material over said lower electrode; and
   selectively depositing an upper electrode over said phase-change material.

15. The method of claim 14 including forming a sidewall spacer in said pore.

16. The method of claim 15 further including forming an electrical contact on one end of said pore.

17. The method of claim 16 wherein selectively depositing includes selectively depositing a lower electrode in the region defined by said sidewall spacer and said contact.

* * * * *